(12) United States Patent
Kitagawa et al.

(10) Patent No.: US 8,416,602 B2
(45) Date of Patent: Apr. 9, 2013

(54) NONVOLATILE SEMICONDUCTOR MEMORY DEVICE

(75) Inventors: Makoto Kitagawa, Kanagawa (JP); Tsunenori Shiimoto, Kanagawa (JP); Tomohito Tsushima, Tokyo (JP)

(73) Assignee: Sony Corporation, Tokyo (JP)

( * ) Notice: Subject to any disclaimer, the term of this patent is extended or adjusted under 35 U.S.C. 154(b) by 162 days.

(21) Appl. No.: 12/929,384

(22) Filed: Jan. 20, 2011

(65) Prior Publication Data

US 2011/0199812 A1 Aug. 18, 2011

(30) Foreign Application Priority Data

Feb. 15, 2010 (JP) ................................. 2010-030528

(51) Int. Cl.
*G11C 11/00* (2006.01)
(52) U.S. Cl.
USPC .......................................... 365/148; 365/158
(58) Field of Classification Search .................. 365/148, 365/158
See application file for complete search history.

(56) References Cited

U.S. PATENT DOCUMENTS

| | | | | |
|---|---|---|---|---|
| 7,616,481 | B2 * | 11/2009 | Mokhlesi et al. | 365/185.03 |
| 2006/0256606 | A1 * | 11/2006 | Park | 365/100 |

FOREIGN PATENT DOCUMENTS

| | | |
|---|---|---|
| JP | 2002-260377 | 9/2002 |
| JP | 2004-164766 | 6/2004 |
| JP | 2005-510005 | 4/2005 |

OTHER PUBLICATIONS

K. Aratani, et al., "A Novel Resistance Memory with High Scalability and Nanosecond Switching," Technical Digest IEDM 2007, pp. 783-787.

* cited by examiner

*Primary Examiner* — Michael Tran
(74) *Attorney, Agent, or Firm* — Rader, Fishman & Grauer PLLC

(57) ABSTRACT

A nonvolatile semiconductor memory device includes: a memory element in which a rate of charge discharge between two electrodes of the memory element differs according to a logical value of stored information; cell wiring connected to one electrode of the memory element; a sense amplifier having a sense node connected to the cell wiring, the sense amplifier reading the logical value of the information by comparing a potential of the sense node with a reference potential; and a readout control circuit capable of switching between a dynamic sense operation performing readout by precharging the cell wiring and discharging or charging the cell wiring via the memory element and a static sense operation performing readout in a state of a current load being connected to the sense node.

20 Claims, 15 Drawing Sheets

FIG.9
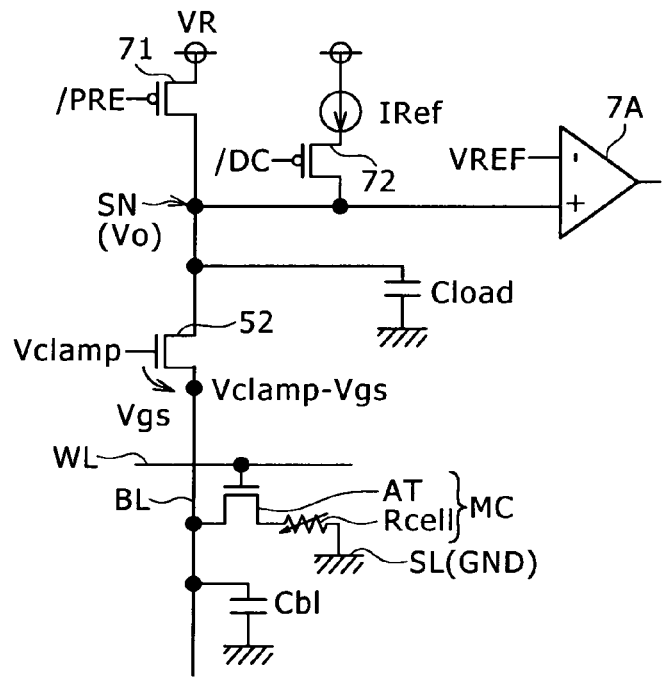
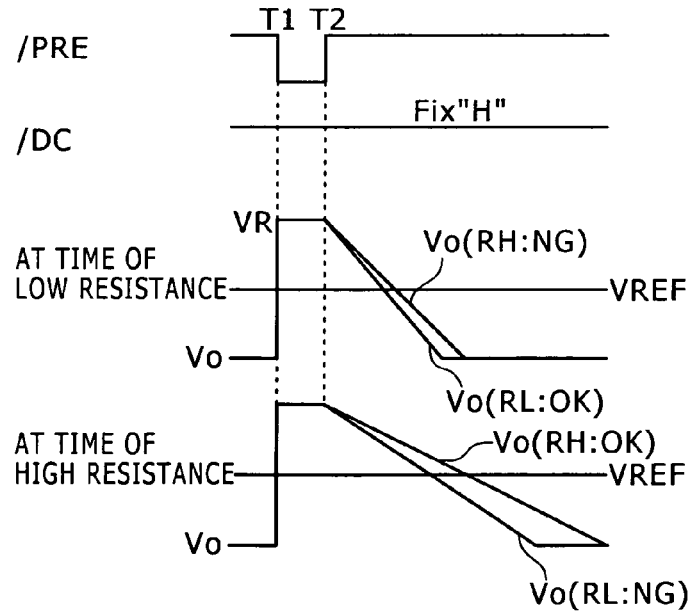
FIG.10A /PRE
FIG.10B /DC
FIG.10C1 AT TIME OF LOW RESISTANCE
FIG.10C2 AT TIME OF HIGH RESISTANCE

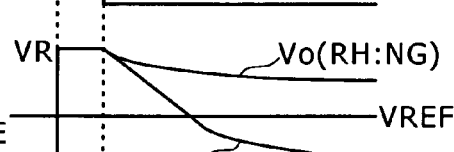
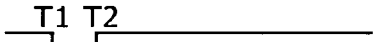
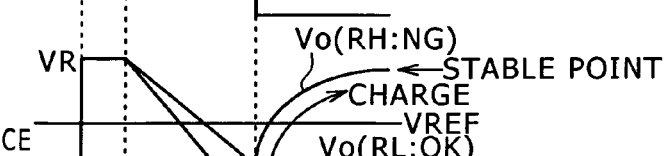
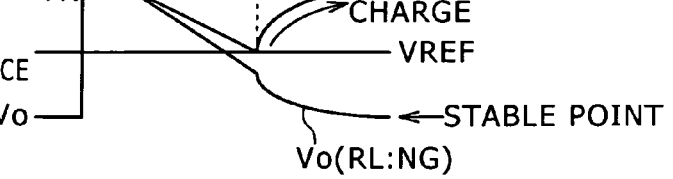

FIG.13

| | FIRST EXAMPLE | SECOND EXAMPLE | THIRD EXAMPLE | FOURTH EXAMPLE | |
|---|---|---|---|---|---|
| WRITE VERIFICATION READ (Rth=10KΩ) | H | S | S | S | ← SorH |
| ORDINARY READ (Rth=100KΩ) | H | H | S | S | ← SorH(orD) |
| ERASE VERIFICATION READ (Rth=1MΩ) | H | H | H | D | ← DorH |

Rth: EXAMPLE OF TARGET RESISTANCE VALUE

D: DYNAMIC READ (FIGS.10A TO 10C2)
S: STATIC READ (FIGS.11A TO 11C2)
H: HYBRID READ (FIGS.12A TO 12C2)

FIG. 14
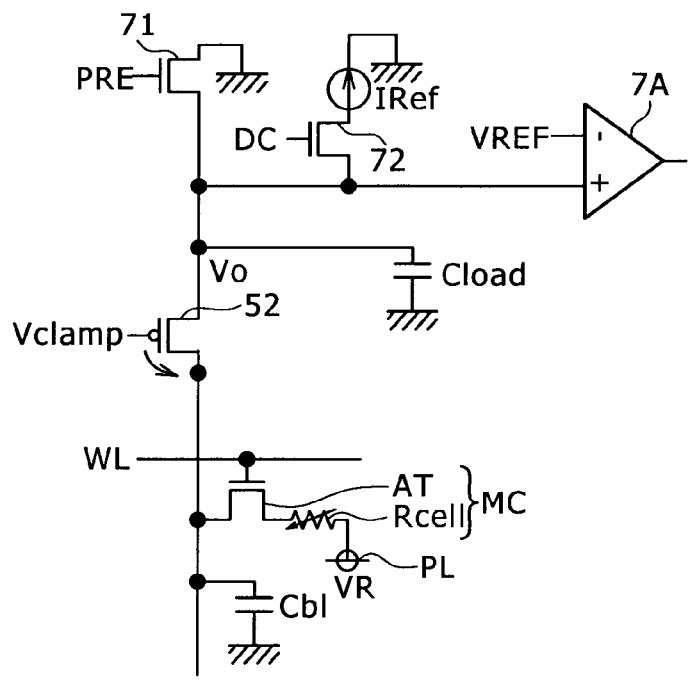
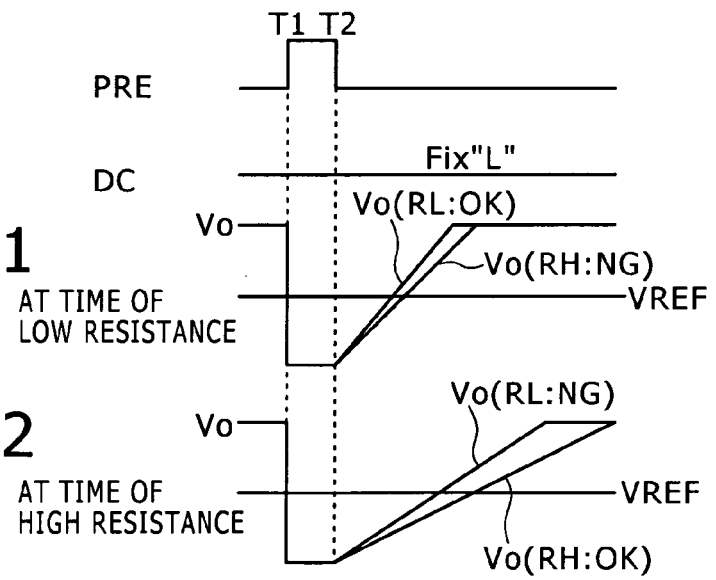
FIG. 15A   PRE
FIG. 15B   DC
FIG. 15C1   Vo   AT TIME OF LOW RESISTANCE
FIG. 15C2   Vo   AT TIME OF HIGH RESISTANCE

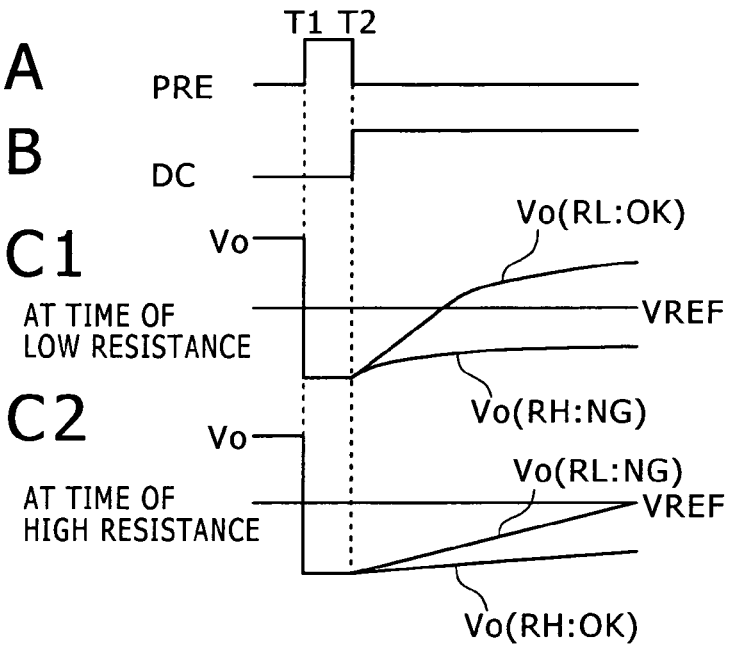
FIG.16A
FIG.16B
FIG.16C1
FIG.16C2
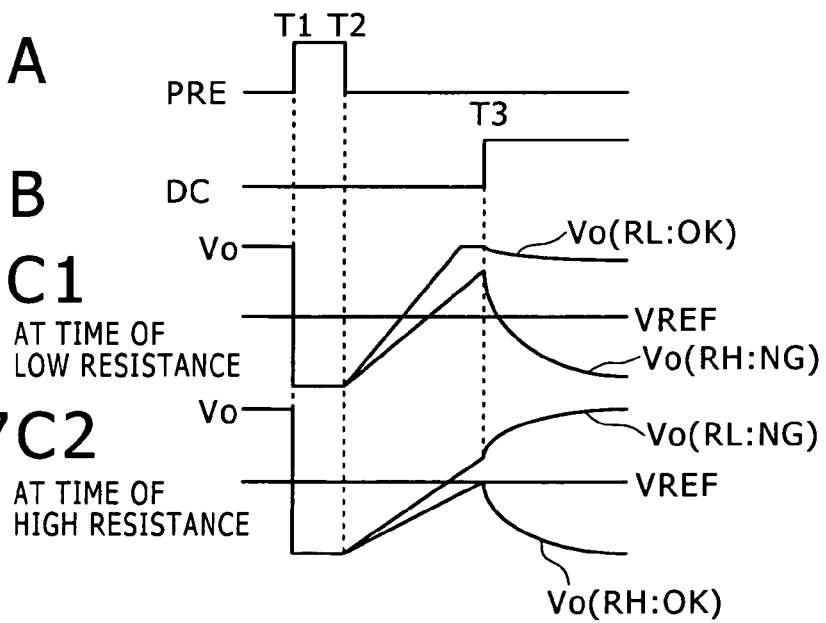
FIG.17A
FIG.17B
FIG.17C1
FIG.17C2

FIG.18
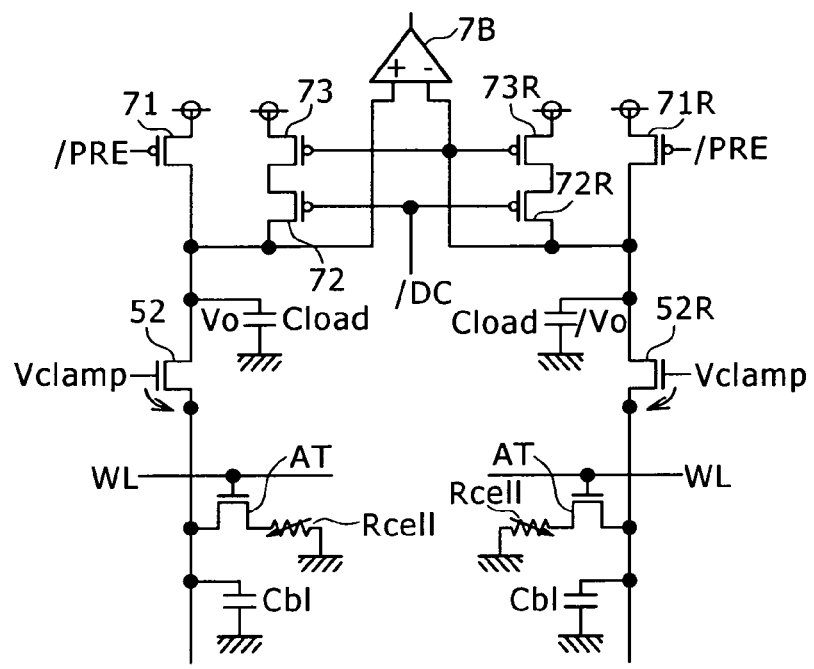
FIG.19A
FIG.19B
FIG.19C1
FIG.19C2
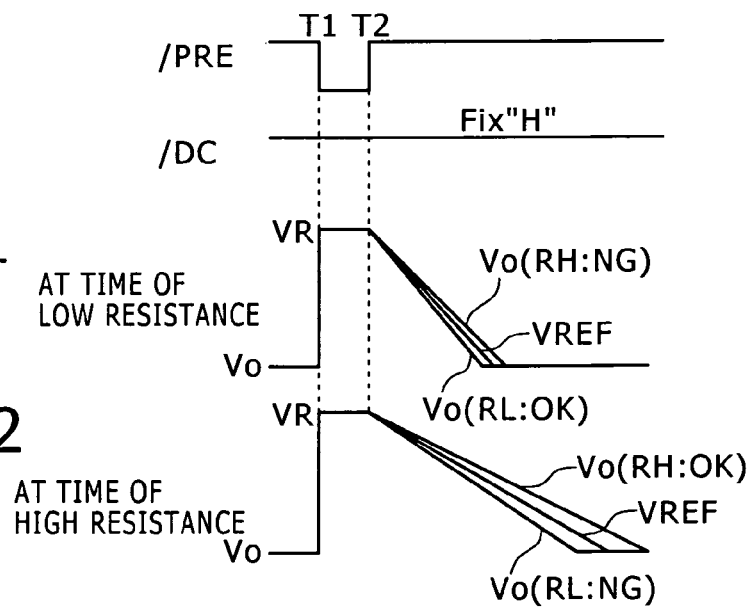

FIG.20C1 
AT TIME OF
LOW RESISTANCE
FIG.20C2 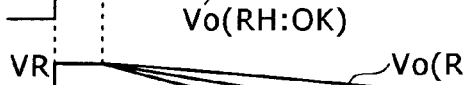
AT TIME OF
HIGH RESISTANCE

FIG.21C1 
AT TIME OF
LOW RESISTANCE
FIG.21C2 
AT TIME OF
HIGH RESISTANCE
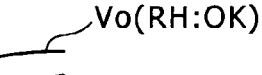

FIG. 22
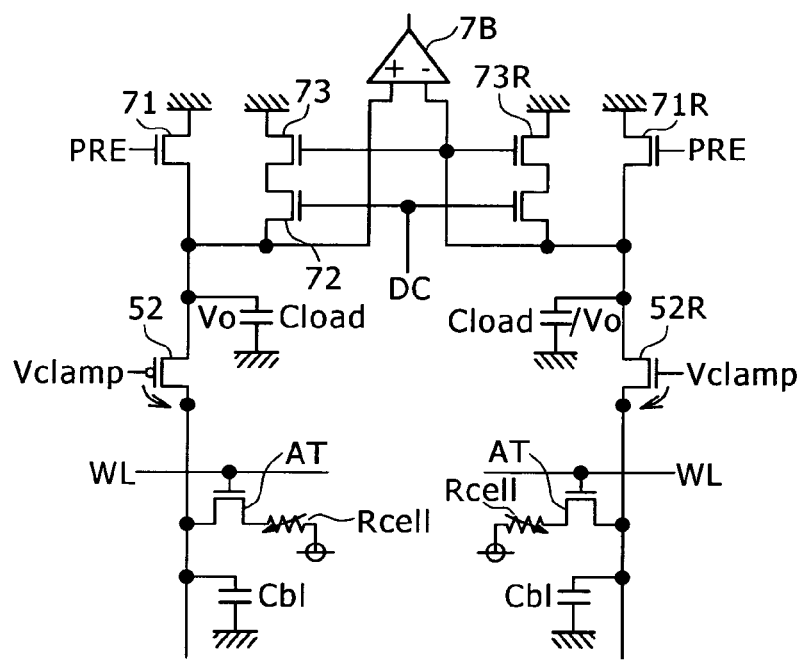
FIG. 23A /PRE
FIG. 23B DC
FIG. 23C1
AT TIME OF LOW RESISTANCE
FIG. 23C2
AT TIME OF HIGH RESISTANCE
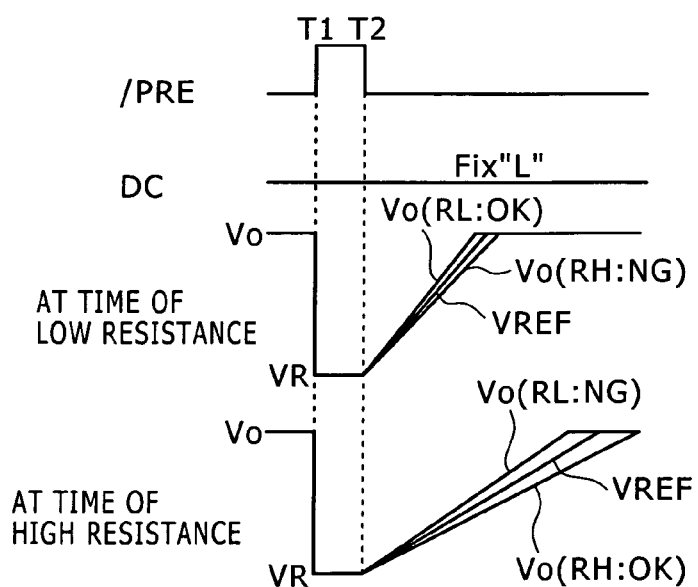

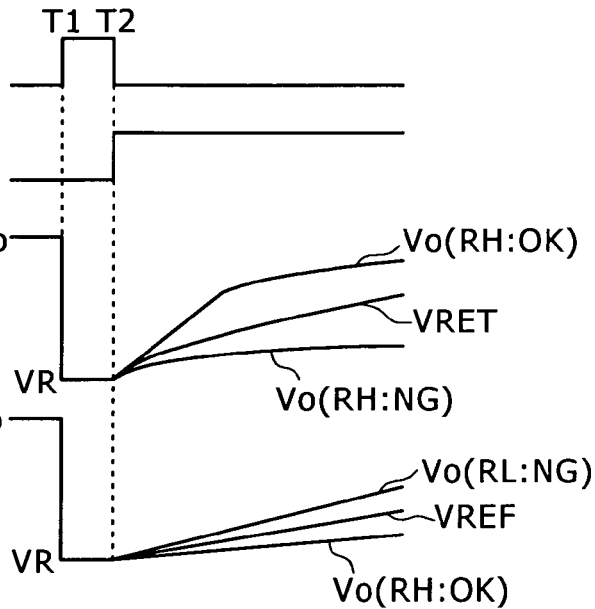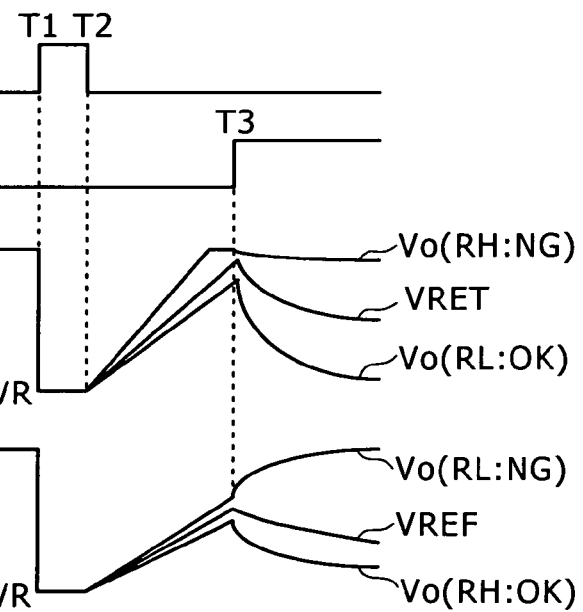

NONVOLATILE SEMICONDUCTOR MEMORY DEVICE

BACKGROUND OF THE INVENTION

1. Field of the Invention

The present invention relates to a nonvolatile semiconductor memory device having a variable cell resistance Rcell in which a rate of charge discharge between two electrodes of the variable cell resistance Rcell differs according to the logical value of stored information.

2. Description of the Related Art

A nonvolatile memory device in which a precharge voltage is applied to a bit line, and a difference in rate of discharge of the precharge voltage is read out is known.

A nonvolatile semiconductor memory device to which such a readout method can be applied is typified by a (flash) EEPRPM.

Meanwhile, a resistance change type memory device is drawing attention as a nonvolatile memory device in which data is rewritable at high speed, to replace an FG type (flash) EEPROM.

As a resistance change type memory device, a so-called ReRAM is known in which a resistance change when conductive ions are input to or output from a conductive film within a variable cell resistance Rcell is made to correspond to a state of memory (see K. Aratani, etc., "A Novel Resistance Memory with High Scalability and Nanosecond Switching," Technical Digest IEDM 2007, pp. 783-786, for example).

A system that performs verification readout at times of writing and erasure as in ordinary flash memories and the like is under consideration for a purpose of ensuring reliability of the rewriting characteristics, retention characteristics and the like of the ReRAM and for application of the ReRAM to multivalued memories (see Japanese Patent Laid-Open Nos. 2002-260377, 2005-510005, and 2004-164766 (hereinafter referred to as Patent Documents 1 to 3), for example).

Current control at a time of verification readout in an ordinary flash memory makes a readout current (sense current) substantially constant, and thus different threshold values are verified by changing the gate potential of a memory transistor. This operating system has an advantage in that sense timing, a load on a sense node, and the like are hardly dependent on the threshold values to be verified because of the constant operating current.

SUMMARY OF THE INVENTION

However, the ReRAM has limitations different from those of the flash memory.

The variable cell resistance Rcell of the ReRAM has only two terminals. That is, the variable cell resistance Rcell has only two terminals in which current flows as in a source terminal and a drain terminal in the case of the flash memory, and does not have a gate terminal. In a case of reading different resistance values at the time of verification, suppose that a precharge voltage (=VR) applied to the ReRAM at the time of readout is constant, and that the resistance (cell resistance) value of the variable cell resistance Rcell of the ReRAM is Rcell. Then, a readout current is (VR/Rcell). This means that the readout current is changed when the value of the cell resistance Rcell changes.

In the case of the ReRAM, the value of the cell resistance Rcell differs by orders of magnitude according to the logical value of stored information. Thus, for the above reasons, when verification readout is to be performed at high speed, the following timing control may become essential.

Specifically, when a bit line potential (hereinafter a BL potential) is lowered by discharge through the variable cell resistance Rcell and verification readout is performed, sense timing needs to be delayed in a case of the resistance to be sensed being a high resistance because of low speed of the discharge of the BL potential at a time of erasure verification. On the other hand, in a case of the resistance to be sensed being a low resistance, sense timing needs to be advanced because of high speed of the discharge of the BL potential at a time of writing verification. When sense timing is delayed at the time of writing verification, a BL charge disappears, and thus normal sense operation cannot be performed.

Such a difference in optimal sense timing according to the logical value of information to be read out is not limited to the ReRAM. That is, with a system that reads out the magnitude of a cell current by dynamic discharge readout without controlling the gate voltage of a memory transistor, a shift in optimum sense timing occurs even in a nonvolatile memory device other than a resistance change type memory, such as a flash EEPROM.

A method of reading out the discharge rate of such a precharge charge as it is without a discharge current being regulated to be substantially constant (by the gate voltage of a transistor or the like) will hereinafter be referred to as a "dynamic read." On the other hand, a method of reading out the discharge rate of such a precharge charge with a discharge current held substantially constant will hereinafter be referred to as a "static read."

The dynamic read and the static read, aside from the names thereof, are known as readout systems of nonvolatile memories not limited to the ReRAM. In general, one of the dynamic read and the static read is used. For example, in relation to an example of the ReRAM, the above-described Patent Documents 1 and 2 disclose a dynamic read, and the above-described Patent Document 3 discloses a static read.

The static sense system of the static read generally senses a static and stable voltage, and therefore has an advantage of being able to perform readout with higher accuracy as readout timing is delayed more.

However, with the static sense system, operation at as high a speed as that of dynamic sensing cannot be performed in that a precharge operation before the sense operation is necessary and in that a current load itself needs to be set up.

On the other hand, the dynamic sense system does not require precharge to be performed again immediately before sense operation, and is thus suitable for high-speed readout.

However, the dynamic sense system cannot perform highly accurate readout, and has a narrow margin of erroneous operation, so that timing setting is difficult. The difficulty in timing setting means that the dynamic read can be applied only when the resistance value of the variable cell resistance Rcell as an object of readout changes with high accuracy.

The dynamic read and the static read thus have advantages and disadvantages. There is a desire for a nonvolatile semiconductor memory of a circuit configuration that utilizes the advantages of both the dynamic read and the static read and which has high speed to a certain degree and a relatively high readout accuracy.

It is desirable to provide a nonvolatile semiconductor memory device that can satisfy rapidity and readout accuracy.

A nonvolatile semiconductor memory device according to an embodiment of the present invention includes a variable cell resistance Rcell, a sense amplifier, and a readout control circuit.

A rate of charge discharge between two electrodes of the variable cell resistance Rcell differs according to the logical value of stored information.

The sense amplifier has a sense node connected to cell wiring, the cell wiring being connected to one electrode of the variable cell resistance Rcell. The sense amplifier reads the logical value of the information by comparing a potential of the sense node with a reference potential.

The readout control circuit can switch between a dynamic sense operation and a static sense operation. In the dynamic sense operation, readout is performed by precharging the cell wiring and discharging or charging the cell wiring via the memory element. At this time, the readout is performed by a voltage difference between a precharge voltage and a voltage of the other electrode of the memory element, for example. In the static sense operation, readout is performed in a state of a current load being connected to the sense node.

According to the above constitution, for example, when there is no need for a very high readout accuracy, the readout control circuit controls the sense amplifier to read the logical value (information) of the variable cell resistance Rcell by only the dynamic sense operation.

When a high readout accuracy is required, on the other hand, the readout control circuit controls the sense amplifier to read the logical value (information) of the variable cell resistance Rcell by only the static sense operation.

Further, when a high readout accuracy is necessary but high-speed readout is to be performed, the cell wiring is charged or discharged rapidly with the current load disconnected as in the dynamic sense operation at a time of a start of read operation, for example. After the rapid charge or discharge is performed to a certain extent, the current load is connected to the sense node as in the static sense operation at a stage in the middle of the charge or discharge even when the potential of the cell wiring is not sufficient for the reading of the sense amplifier. Then, the potential of the cell wiring changes stably and rapidly to a potential corresponding to an equivalent resistance value of the variable cell resistance Rcell. Therefore the potential of the cell wiring changes to a sufficient potential for the reading of the sense amplifier. Then, the sense amplifier is started. Thereby stable sensing with relatively high speed is made possible.

According to the present invention, it is possible to provide a nonvolatile semiconductor memory device that can satisfy rapidity and readout accuracy.

BRIEF DESCRIPTION OF THE DRAWINGS

FIG. 9 is a schematic diagram of a column circuit configuration relating to the first embodiment;

FIGS. 10A, 10B, 10C1, and 10C2 are timing charts of a dynamic read;

FIGS. 11A, 11B, 11C1, and 11C2 are timing charts of a static read;

FIGS. 12A, 12B, 12C1, and 12C2 are timing charts of a hybrid read;

FIG. 13 is a table showing four examples of combinations of read modes;

FIG. 14 is a schematic diagram of a column circuit configuration relating to the second embodiment;

FIGS. 15A, 15B, 15C1, and 15C2 are timing charts of a dynamic read;

FIGS. 16A, 16B, 16C1, and 16C2 are timing charts of a static read;

FIGS. 17A, 17B, 17C1, and 17C2 are timing charts of a hybrid read;

FIG. 18 is a schematic diagram of a column circuit configuration relating to the third embodiment;

FIGS. 19A, 19B, 19C1, and 19C2 are timing charts of a dynamic read;

FIGS. 20A, 20B, 20C1, and 20C2 are timing charts of a static read;

FIGS. 21A, 21B, 21C1, and 21C2 are timing charts of a hybrid read;

FIG. 22 is a schematic diagram of a column circuit configuration relating to the fourth embodiment;

FIGS. 23A, 23B, 23C1, and 23C2 are timing charts of a dynamic read;

FIGS. 24A, 24B, 24C1, and 24C2 are timing charts of a static read; and

FIGS. 25A, 25B, 25C1, and 25C2 are timing charts of a hybrid read.

DETAILED DESCRIPTION OF THE PREFERRED EMBODIMENTS

Figure 1A:
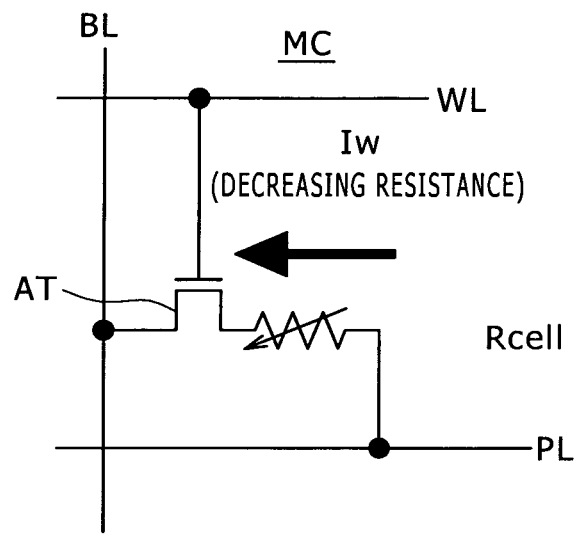
FIGS. 1A and 1B are diagrams of an equivalent circuit of a memory cell common to a first to a fourth embodiment and a modification example.

Preferred embodiments of the present invention will be described in the following order with reference to the drawings by taking an ReRAM as an example.
1. Outlines
2. First Embodiment: Single-Ended Sense Amplifier
3. Second Embodiment: Single-Ended Sense Amplifier with Cell Current in Opposite Direction
4. Third Embodiment: Current Mirror Type Sense Amplifier
5. Fourth Embodiment: Current Mirror Type Sense Amplifier with Current in Opposite Direction
6. Modification Example <1. Outlines>

A nonvolatile semiconductor memory device to which the present invention is applied has a "readout control circuit" including a constitution capable of controlling connection and non-connection of a current load to the sense node of a sense amplifier.

This readout control circuit can switch between dynamic sense operation and static sense operation, and also includes a constitution for precharge.

Dynamic sense operation in this case refers to operation for sensing that supplies a precharge voltage to cell wiring (for example a bit line) and which makes the cell wiring (bit line) be discharged or charged via a memory element (for example a variable cell resistance Rcell). More specifically, in dynamic sense operation, for example, a sense current is passed through the variable cell resistance Rcell by a voltage difference between the cell wiring and an electrode (or wiring) on an opposite side of the variable cell resistance Rcell from the cell wiring. Because there is no source of supply of external charge other than a precharge charge on the sense node side, the potential of the cell wiring rapidly falls or rises. Whether the potential of the cell wiring falls or rises depends on the polarity of the precharge voltage and the voltage supplied to the electrode (or wiring) on the opposite side (positive or negative direction of the voltages).

Static sense operation refers to operation for sensing including an operation of charging or discharging the cell wiring in a state of a current load for supplying or drawing out a substantially constant current being connected to the sense node. When the current flowing through the cell wiring is thus regulated to be constant or substantially constant, a rate of potential change becomes correspondingly slow, but the potential change has a rate proportional or substantially proportional to the resistance value of the variable cell resistance Rcell. Therefore stable operation can be performed. Given this stable operation, the timing of the sense amplifier can be controlled easily, and highly accurate readout can be performed.

In the above-described dynamic sense operation, on the other hand, charge or discharge is performed rapidly, so that high rapidity is obtained, but threshold value setting and starting timing control for the sense amplifier are relatively difficult. Thus, in a case of a resistance change memory, for example, it is not desirable to apply dynamic sense operation unless particular conditions, such as a relatively high resistance value and a great resistance change according to memory information, are met.

When whether a readout object has a low resistance or a high resistance is known to a certain extent in advance, for example, the readout control circuit in embodiments of the present invention can switch between two sense operations according to information indicating whether the readout object has a low resistance or a high resistance at a time of verification readout, for example. As the information, a read signal or an erase signal commanding an operation (writing or erasing operation) immediately preceding verification readout operation, for example, can be used.

In ordinary readout, on the other hand, whether the readout object has a low resistance or a high resistance is not known in advance. However, whether dynamic sense operation is suitable or whether static sense operation is suitable can be determined according to the memory material and structure of the variable cell resistance Rcell, reliability data, and the like. Thus, the suitable method is adopted.

In yet another mode, hybrid sense operation combining dynamic sense operation and static sense operation can be performed. Switching control and the like of the hybrid sense operation will be described later. Because the hybrid sense operation has advantages (rapidity and high accuracy) of the two sense operations, this hybrid method is applicable to each of write verification readout, erase verification readout, and ordinary readout.

Embodiments of the present invention will hereinafter be described in further detail by taking a case where the three sense operations are selectable as an example and by taking an ReRAM as an example of a nonvolatile memory.

<2. First Embodiment>
[Memory Cell Configuration]

Figure 1B:
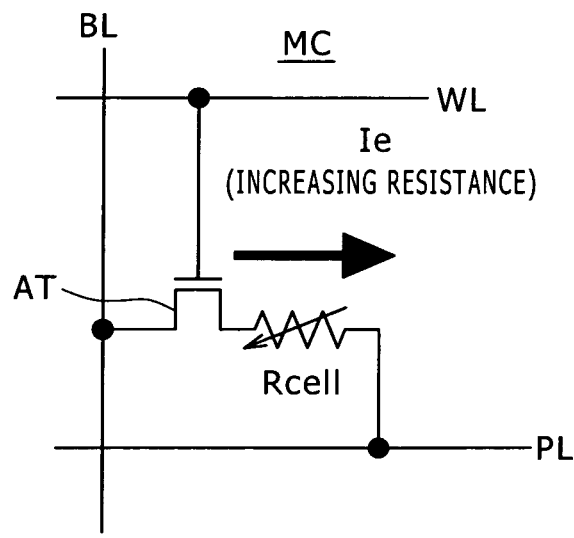

FIG. 1A and FIG. 1B are diagrams of an equivalent circuit of a memory cell common to embodiments of the present invention. Incidentally, while FIG. 1A shows the direction of a writing current Iw, and FIG. 1B shows the direction of an erasing current Ie, the configuration of the memory cell itself is common to both diagrams.

The memory cell MC illustrated in FIGS. 1A and 1B has one memory cell resistance Rcell as the "variable cell resistance Rcell" and one access transistor AT.

One terminal of the memory cell resistance Rcell is connected to a plate line PL. Another terminal of the memory cell resistance Rcell is connected to the source of the access transistor AT. The drain of the access transistor AT is connected to a bit line BL. The gate of the access transistor AT is connected to a word line WL as an "access line."

Incidentally, while the bit line BL and the plate line PL are orthogonal to each other in FIGS. 1A and 1B, the bit line BL and the plate line PL may be arranged in parallel with each other.

Figure 2:
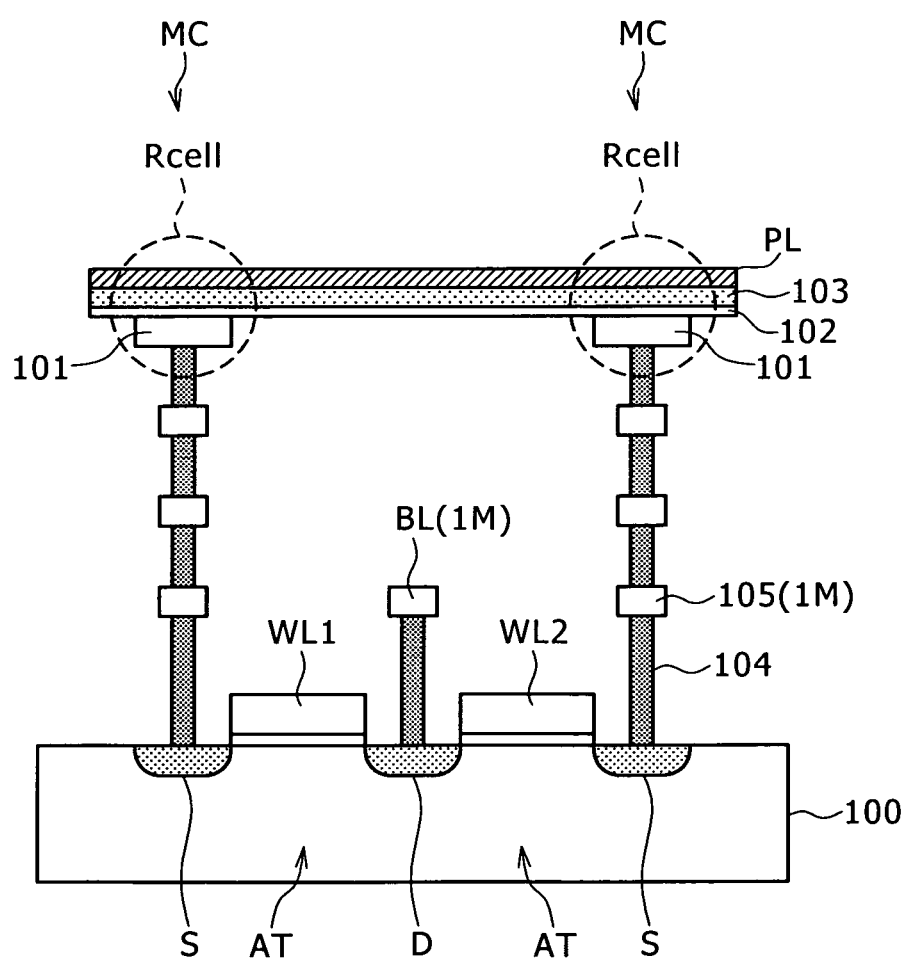
FIG. 2 is a sectional view of a device structure of two memory cell parts adjacent to each other.

FIG. 2 shows a device structure of a part corresponding to two memory cells MC adjacent to each other. FIG. 2 is a schematic sectional view, and is not hatched. A blank part in FIG. 2 is filled with an insulating film or forms another part (a part of the other part) unless otherwise specified.

The access transistors AT of the memory cells MC illustrated in FIG. 2 are formed in a semiconductor substrate 100.

More specifically, two impurity regions as the source (S) and drain (D) of an access transistor AT are formed in the semiconductor substrate 100, and a gate electrode made of polysilicon or the like is formed on a substrate region between the two impurity regions with a gate insulating film interposed between the semiconductor substrate 100 and the gate electrode. In this case, the gate electrode forms a word line WL1 or WL2.

The drain (D) is shared by the two memory cells MC, and is connected to a bit line BL formed by a first wiring layer (1M).

A plug 104 and a landing pad 105 (formed of the wiring layer) are repeatedly piled up on the source (S), and a memory cell resistance Rcell is formed on the plugs 104 and the landing pads 105. The memory cell resistance Rcell is formed in an arbitrary layer of the multilayer wiring structure. In this case, however, the memory cell resistance Rcell is formed in roughly a fourth or fifth layer.

The memory cell resistance Rcell is of a film composition (laminate) having an insulator film 102 and a conductor film 103 between a lower electrode 101 and an upper electrode as a plate line PL.

Materials for the insulator film 102 include for example $SiN$, $SiO_2$, and $Gd_2O_3$.

Materials for the conductor film 103 include for example metallic films, alloy films (for example a CuTe alloy film), and metallic compound films containing one or more metallic elements selected from Cu, Ag, and Zr. Incidentally, metallic elements other than Cu, Ag, and Zr may be used as long as the metallic elements have a property of ionizing easily. In addition, an element combined with at least one of Cu, Ag, and Zr is desirably at least one element of S, Se, and Te. The conductor film 103 is formed as an "ion supply layer."

Figure 3A:
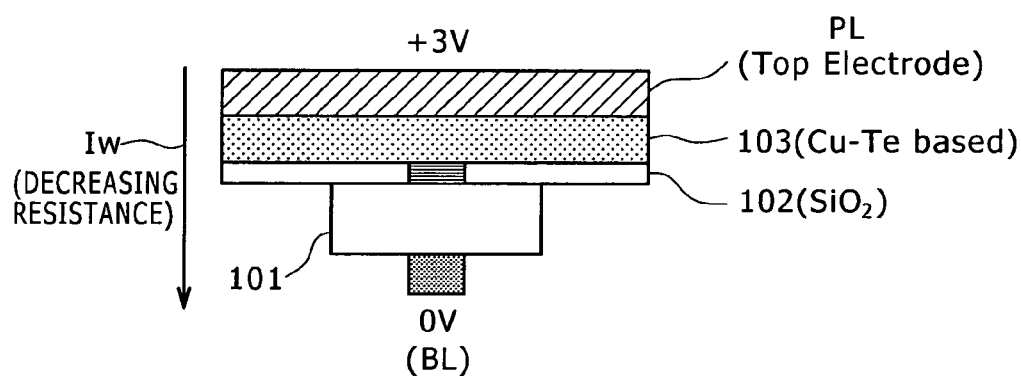
FIGS. 3A and 3B are diagrams showing a section and operation of a variable cell resistance (memory element)
Figure 3B:
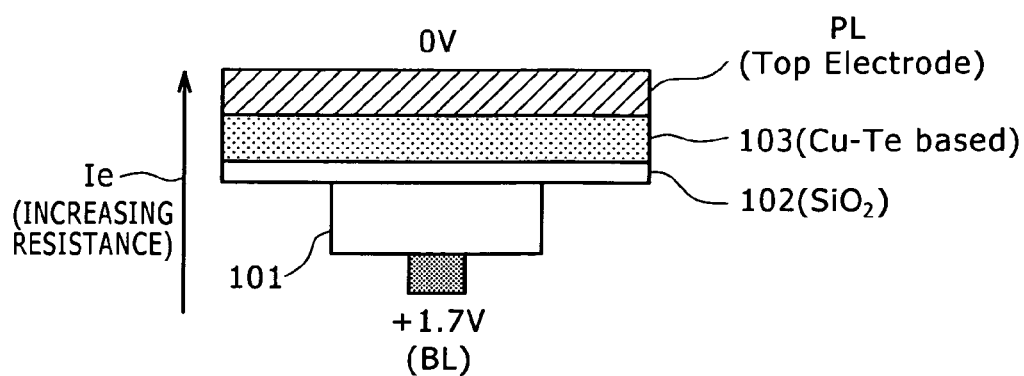

FIGS. 3A and 3B are enlarged views of the memory cell resistance Rcell, to which views directions of current and an example of values of applied voltage are added.

FIGS. 3A and 3B represent, as an example, a case where the insulator film 102 is formed of $SiO_2$, and the conductor film 103 is formed of a CuTe alloy base alloy compound (Cu—Te based).

In FIG. 3A, a voltage is applied to the lower electrode 101 and the upper electrode (plate line PL) with the insulator film 102 side as a negative electrode side and with the conductor film 103 side as a positive electrode side. For example, the bit line BL is grounded at 0 [V], and for example +3 [V] is applied to the plate line PL.

Then, Cu, Ag, and Zr included in the conductor film 103 have a property of being ionized and attracted to the negative electrode side. Conductive ions of these metals are injected into the insulator film 102. Thus, the insulator film 102 is decreased in insulation quality, and acquires conductivity with the decrease in insulation quality. As a result, a writing current Iw in the direction shown in FIG. 3A flows. This operation will be referred to as writing (operation) or a set (operation).

Conversely, in FIG. 3B, a voltage is applied to the lower electrode 101 and the upper electrode (plate line PL) with the insulator film 102 side as a positive electrode side and with the conductor film 103 side as a negative electrode side. For example, the plate line PL is grounded at 0 [V], and for example +1.7 [V] is applied to the bit line BL.

Then, the conductive ions injected into the insulator film 102 are returned to the conductor film 103, so that the memory cell resistance Rcell is reset to the state of a high resistance value before the writing. This operation will be referred to as erasing (operation) or a reset (operation). In the reset, an erasing current Ie in the direction shown in FIG. 3B flows.

Incidentally, in the following, the set refers to "sufficient injection of conductive ions into the insulator film," and the reset refers to "sufficient extraction of conductive ions from the insulator film."

On the other hand, one state (the set or the reset) is arbitrarily defined as a data writing state, and the other state is arbitrarily defined as an erasing state.

In the following description, a case where the insulation quality of the insulator film 102 is decreased, and the resistance value of the memory cell resistance Rcell as a whole is lowered to a sufficient level is made to correspond to data "writing" (set). Conversely, a case where the insulation quality of the insulator film 102 is restored to an original initial state, and the resistance value of the memory cell resistance Rcell as a whole is raised to a sufficient level is made to correspond to data "erasure" (reset).

An arrow of a circuit symbol of the memory cell resistance Rcell shown in FIG. 1 is generally in the same direction as current at the time of the set (at the time of writing in this case).

By repeating the set and the reset described above, a binary memory is realized in which the resistance value of the memory cell resistance Rcell is reversibly changed between a high resistance state and a low resistance state. In addition, the memory cell resistance Rcell retains data even when voltage application is stopped, and therefore functions as a nonvolatile memory.

Incidentally, at the time of the set, the resistance value of the insulator film 102 actually changes according to an amount of metal ions in the insulator film 102. The insulator film 102 can therefore be regarded as a "storage layer" in which data is stored and retained.

By forming a memory cell using the memory cell resistance Rcell and providing a plurality of such memory cells, a memory cell array of a resistance change type memory can be formed. The resistance change type memory includes the memory cell array and a driving circuit (peripheral circuit) of the memory cell array.

[IC Chip Configuration]

Figure 4:
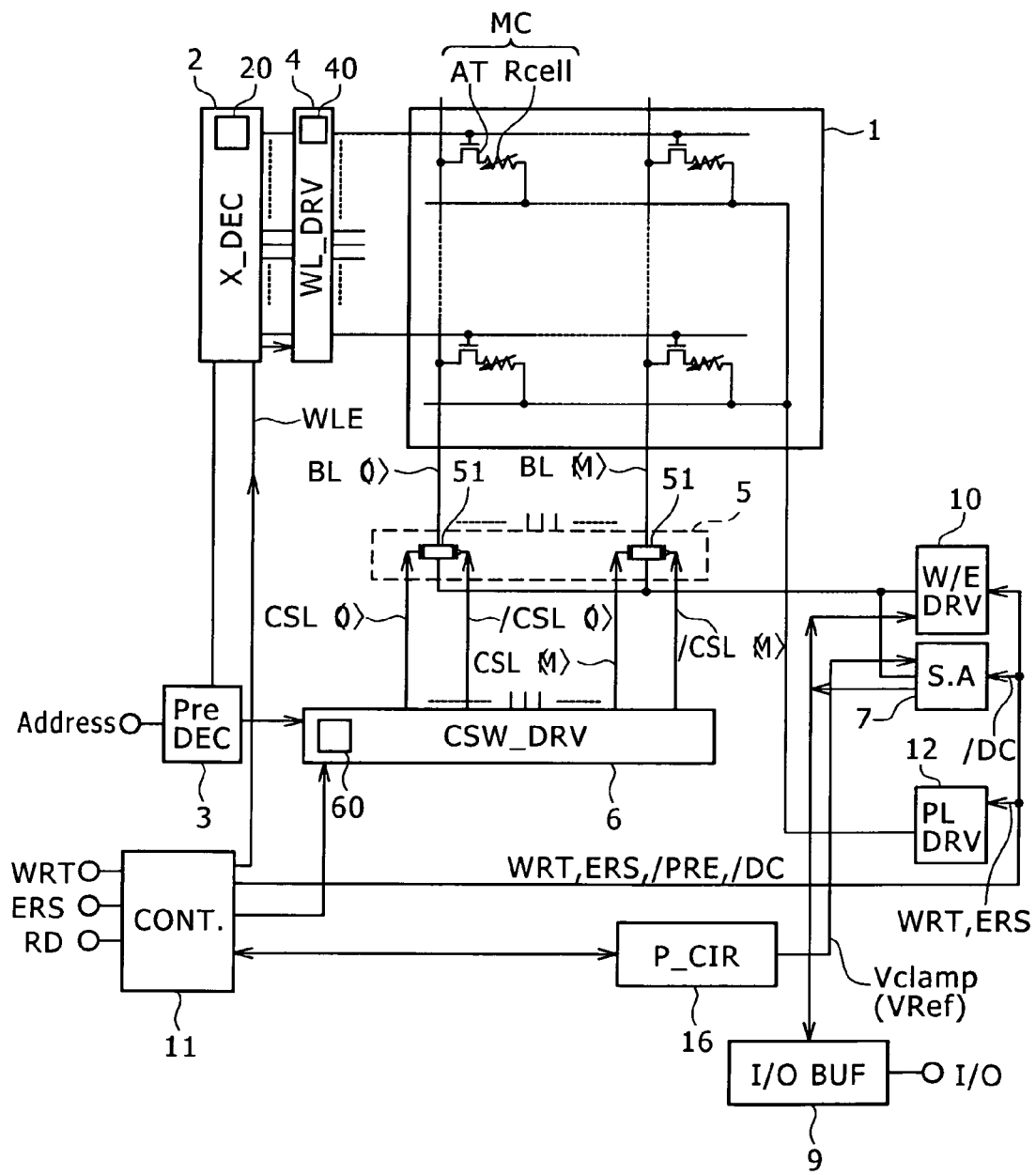
FIG. 4 is a block diagram of an IC chip (memory device) relating to the first to fourth embodiments.

FIG. 4 is a block diagram of an IC chip. A semiconductor memory device illustrated in FIG. 4 has a memory cell array 1 including memory cells MC as shown in FIGS. 1A to 3B arranged in the form of a matrix, with (M+1) memory cells MC arranged in a row direction and with (N+1) memory cells MC arranged in a column direction. The semiconductor memory device is formed by integrating the memory cell array 1 and a peripheral circuit of the memory cell array 1 on an identical semiconductor chip. In this case, "N" and "M" are relatively large natural numbers, and specific values of N and M are set arbitrarily.

In the memory cell array 1, (N+1) word lines WL<0> to WL<N> for commonly connecting the gates of access transistors AT in the (M+1) memory cells MC arranged in the row direction to each other are arranged at predetermined intervals in the column direction. In addition, (M+1) bit lines BL<0> to BL<M> for commonly connecting the drains of access transistors AT in the (N+1) memory cells MC arranged in the column direction to each other are arranged at predetermined intervals in the row direction.

(N+1) plate lines PL for commonly connecting nodes on opposite sides of memory cell resistances Rcell from the access transistors AT in the row direction are arranged at predetermined intervals in the column direction. One terminal of each of the (N+1) plate lines PL is connected to a common line, and the common line is drawn out to the outside of the memory cell array 1.

Incidentally, (M+1) plate lines PL may be arranged so as to be long in the column direction.

As shown in FIG. 4, the peripheral circuit includes an X (address) decoder (X Decoder) 2, a predecoder (Pre DEC) 3 doubling as a Y (address) decoder, a WL driver (WL DRV) 4, a BLI switch 5, and a CSW driver (CSW_DRV) 6. The peripheral circuit includes a sense amplifier (Sense Amp) 7 and an I/O buffer (Input/Output Buffer) 9 for each column. The peripheral circuit includes a writing and erasing driver (W/E DRV) 10, a control circuit (CONT.) 11, a plate driver (PL DRV) 12, and a control voltage generating circuit (P_CIR) 16.

Incidentally, the sense amplifier 7 is provided for each memory cell column, though not shown as such in FIG. 4 for the convenience of schematic representation. In addition, a clock signal generation controlling circuit and the like are not shown in FIG. 4.

The X-decoder 2 is formed with an X-selector (not shown) as a basic unit. The X-decoder 2 is a circuit for decoding an X-address signal input from the predecoder 3, and sending a selected X-selection signal X_SEL to the WL driver 4 on the basis of a result of the decoding. Details of the X-selector will be described later.

The predecoder 3 separates an input address signal (Address) into an X-address signal and a Y-address signal. The predecoder 3 sends the X-address signal X_SEL to the X-decoder 2, and decodes the Y-address signal by a Y-decoding section.

The Y-decoding section of the predecoder 3 is formed with a Y-selector (not shown) as a basic unit. The predecoder 3 is a circuit for decoding the input Y-address signal, and sending a selected Y-selection signal Y_SEL to the CSW driver 6 on the basis of a result of the decoding. Details of the Y-selector will be described later.

The WL driver 4 includes (N+1) WL driver units (not shown) for each word line WL. The output of each WL driver unit is connected with one corresponding word line of the (N+1) word lines WL<0> to WL<N>. One of the WL driver units is selected according to the X-selection signal X_SEL input from the X-decoder 2. The WL driver unit is a circuit for applying a predetermined voltage to the word line WL connected to the output of the WL driver unit when the WL driver unit is selected. Details of the WL driver unit will be described later.

The CSW driver 6 is formed with a CSW driver unit as a basic unit. The CSW driver 6 is a circuit for driving column selecting lines CSL<0> to CSL<M> as wiring for controlling the BLI switch 5. Incidentally, details of the CSW driver unit will be described later.

The BLI switch 5 is for example a set of switches 51 each formed by an NMOS transistor (or a PMOS transistor may be used) alone or a transfer gate shown in FIG. 4. In this case, the switches 51 are connected to the corresponding bit lines BL, and there are (M+1) switches 51 in total.

Suppose in the following that each of the switches forming the BLI switch 5 is a transfer gate.

The writing and erasing driver 10 is connected to the I/O buffer 9. The writing and erasing driver 10 is supplied with externally input data from the I/O buffer 9, and variably controls data retained by the sense amplifier 7 according to the input data.

The output node of the sense amplifier 7 is connected to the I/O buffer 9. The sense amplifier 7 compares a potential change in the bit line BL which potential change is input via the switch 51 in an on state with a reference potential.

The control circuit 11 is supplied with a writing enable signal WRT, an erasure enable signal ERS, and a data readout signal RD. The control circuit 11 operates on the basis of the three signals.

The control circuit 11 has the following five functions.

(1) A function of word line control that supplies a WL selection enable signal WLE to the individual WL driver units within the WL driver 4.

(2) A function of controlling the CSW driver 6 via the predecoder 3 (or directly) and thereby setting the switches 51 in a conducting state or in a non-conducting state individually.

(3) A function of controlling supply of operating voltage by supplying the writing enable signal WRT or the erasure enable signal ERS to the writing and erasing driver 10 at a time of writing or erasure.

(4) A function of controlling supply of operating voltage by supplying the writing enable signal WRT or the erasure enable signal ERS to the plate driver 12, as required, at a time of writing or erasure.

(5) A function of controlling the control voltage generating circuit 16 to output a clamp voltage Vclamp or the like at a time of readout or verification readout operation.

Incidentally, only references of the various control signals output by the control circuit 11 are shown in FIG. 4. Details of changes in level of the control signals will be described later.

[Control System Circuit]

Description will next be made of the X-selector as a basic configuration of the X-decoder 2 and the Y-selector as a basic configuration of a Y-decoder function of the predecoder 3. Then, description will be made of the WL driver unit as a basic configuration of the WL driver 4.

Figure 5:
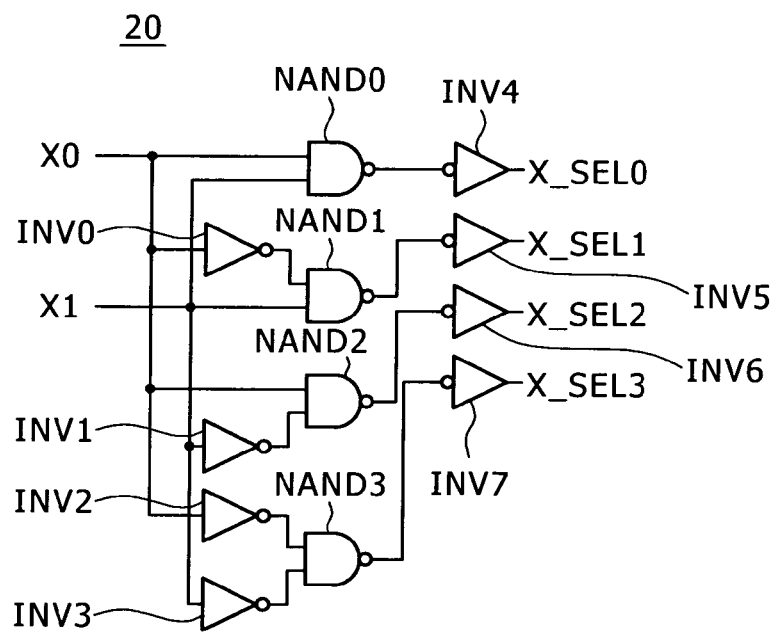
FIG. 5 is a circuit diagram of an X-selector.

FIG. 5 shows an example of a circuit of the X-selector 20.

The X-selector 20 illustrated in FIG. 5 includes four inverters INV0 to INV3 in a first stage, four NAND circuits NAND0 to NAND3 in an intermediate stage, and four other inverters INV4 to INV7 connected in a rear stage.

The X-selector 20 is a circuit supplied with X-address bits X0 and X1 and activating (for example setting to a high level) one of X-selection signals X_SEL0 to X_SEL3 according to a result of decoding the X-address bits X0 and X1.

FIG. 5 represents an example of 2-bit decoding. However, the X-decoder 2 is realized so as to be able to handle input of other than 2 bits by expansion or multistage development of the configuration of FIG. 5 according to the number of bits of the X-address signal input to the X-decoder 2.

Figure 6:
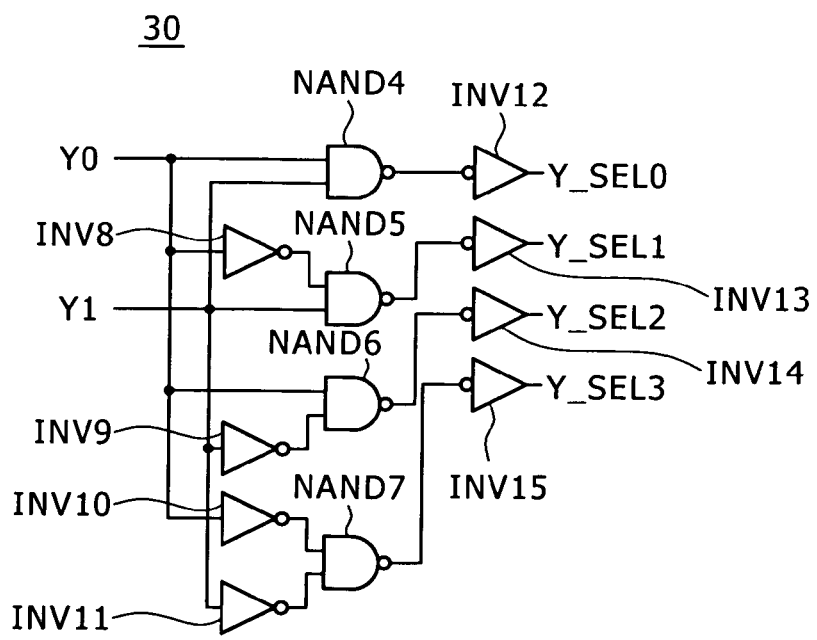
FIG. 6 is a circuit diagram of a Y-selector.

FIG. 6 shows an example of a circuit of the Y-selector 30.

The Y-selector 30 illustrated in FIG. 6 includes four inverters INV8 to INV11 in a first stage, four NAND circuits NAND4 to NAND7 in an intermediate stage, and four other inverters INV12 to INV15 connected in a rear stage.

The Y-selector 30 is a circuit supplied with Y-address bits Y0 and Y1 and activating (for example setting to a high level) one of Y-selection signals Y_SEL0 to Y_SEL3 according to a result of decoding the Y-address bits Y0 and Y1.

FIG. 6 represents an example of 2-bit decoding. However, the predecoder 3 is realized so as to be able to handle input of other than 2 bits by expansion or multistage development of the configuration of FIG. 6 according to the number of bits of the Y-address signal input to the predecoder 3.

Figure 7:
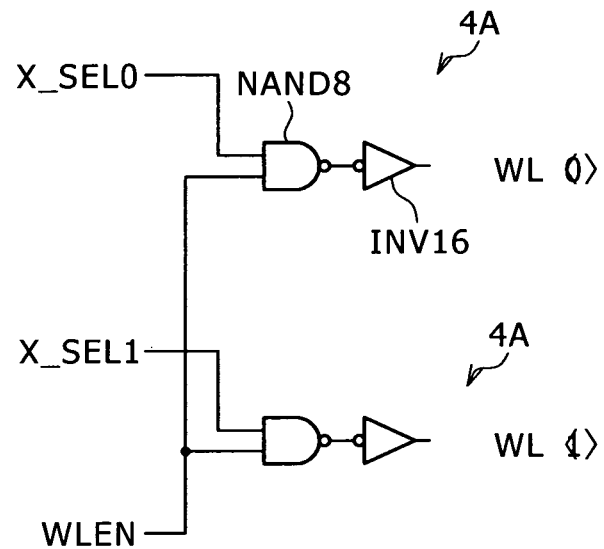
FIG. 7 is a circuit diagram of two WL driver units.

FIG. 7 is a circuit diagram showing two WL driver units 4A.

The WL driver units 4A illustrated in FIG. 7 are a part of the (N+1) WL driver units 4A provided in the WL driver 4, the (N+1) WL driver units 4A being equal in number to the number of cells in the column direction.

The (N+1) WL driver units 4A operate according to one X-selection signal X_SEL0 or X_SEL1 selected (activated) by the X-selector 20 shown in FIG. 5 or the like. The WL driver units 4A activate one word line WL<0> or WL<1> corresponding to the X-selection signal X_SEL0 or X_SEL1.

The WL driver units 4A illustrated in FIG. 7 include a NAND circuit NAND8 and an inverter INV16.

The WL selection enable signal WLE is input to one input of the NAND circuit NAND8. The X-selection signal X_SEL0 or X_SEL1 is input to another input of the NAND circuit NAND8. The output of the NAND circuit NAND8 is connected to the input of the inverter INV16. The word line WL<0> or WL<1> connected to the output of the inverter INV16 is activated or deactivated.

The WL selection enable signal WLE shown in FIG. 7 is generated in the control circuit 11 in FIG. 4, and then supplied to the row decoder 4.

Figure 8:
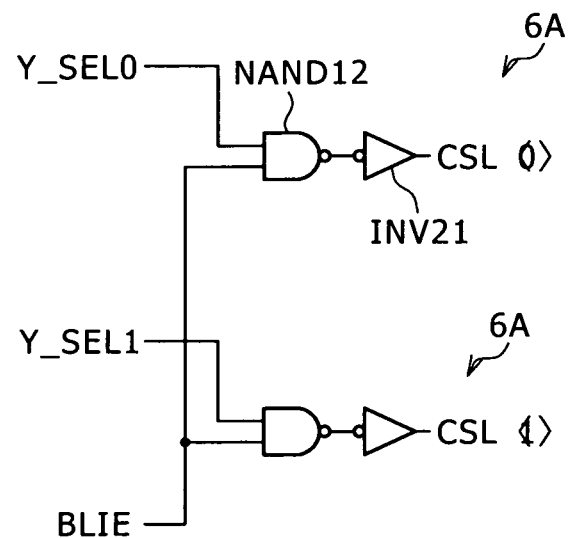
FIG. 8 is a circuit diagram of a CSW driver unit.
Figure 20A:
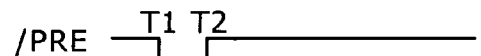
Figure 20B:

FIG. 8 shows an example of a circuit of two CSL driver units 6A.

The CSL driver units 6A illustrated in FIG. 8 include a NAND circuit NAND12 and an inverter INV21 connected to the output of the NAND circuit NAND12.

A BLI enable signal BLIE is input to one input of the NAND circuit NAND12. One Y-selection signal Y_SEL0 or Y_SEL1 selected (activated) by the Y-selector 30 shown in FIG. 6 is input to another input of the NAND circuit NAND12. The output of the NAND circuit NAND12 is set to a low level when the Y-selection signal Y_SEL0 or Y_SEL1 and the BLI enable signal BLIE are both active (high level). The potential of the column selecting line CSL<0> or CSL<1> connected to the output of the inverter INV21 therefore makes a transition to an active level (high level in the present example).

The potential of the column selecting line CSL<0> or CSL<1> is input to the gate of a corresponding switch 51 as shown in FIG. 4.

[Column Circuit and Configuration for Switching Constant-Current Load]

FIG. 9 is a schematic diagram of a column circuit configuration relating to the present embodiment.

In the configuration illustrated in FIG. 9, one memory cell MC (one series connection of an access transistor AT and a memory cell resistance Rcell) is connected to one bit line BL as "cell wiring." The gate of the access transistor AT in the memory cell MC is connected to a word line WL. The source or drain on an opposite side of the access transistor AT from the variable cell resistance Rcell is connected to the bit line BL. The other of the source and drain of the access transistor AT is connected to a source SL (indicated by a circuit symbol GND in this case). In FIG. 9, the load capacitance of the bit line BL is represented by an equivalent capacitance of a reference "Cbl."

A constitution indicated by a reference "7A" is a single-ended sense amplifier 7A for each bit line, the sense amplifier 7A forming the sense amplifier 7 shown in FIG. 4.

The non-inverting input (+) of the sense amplifier 7A is connected to a sense node SN. The inverting input (−) of the sense amplifier 7A is supplied with a constant reference potential VREF from the control circuit 11 or the control voltage generating circuit 16 in FIG. 4. The potential of the sense node SN is represented by a sense node potential Vo in FIG. 9.

A precharge transistor (PMOS) 71 for controlling the application of a readout application voltage VR is connected to the sense node SN. Though not shown in FIG. 9, the gate of the precharge transistor 71 is controlled by a low-active precharge signal (/PRE) supplied from the control circuit 11. Incidentally, the precharge transistor 71 may be connected to the side of the bit line BL. In addition, the readout application voltage VR is set at a magnitude at which readout disturbance is not caused in memory cells other than the memory cell as readout object connected to the bit line BL.

A load separating switch 52 is connected between the bit line BL and the sense node SN (non-inverting input "+") of the sense amplifier 7A. Though not shown in FIG. 4, the load separating switch 52 is provided for each bit line at a position between the switch 51 and the bit line BL, for example. The load separating switch 52 has a function of disconnecting the bit line BL from a load on the sense node side when controlling the bit line BL (cell wiring) at a constant voltage and amplifying the potential of the sense node SN.

The load separating switch 52 is of an NMOS transistor configuration in the example shown in FIG. 9. However, the load separating switch 52 may be of a PMOS transistor configuration, or may be of a transfer gate configuration formed by connecting an NMOS transistor and a PMOS transistor in parallel with each other.

More specifically, the load separating switch 52 operates as follows.

At a time of data readout, a clamp voltage Vclamp is applied from the control voltage generating circuit 16 in FIG. 4 to the gate of the load separating switch 52 (NMOS). A current flows through the load separating switch 52 when the variable cell resistance Rcell in the memory cell MC is charged or discharged. The NMOS configuration supposes that a discharge current flows from the sense node SN to the variable cell resistance Rcell. In this case, the source potential of the load separating switch 52 is clamp-controlled to a voltage (constant potential) lowered from the clamp voltage Vclamp by the gate-to-source voltage Vgs of the load separating switch 52. In a state of this clamp voltage being stable, the transistor is maintained at a turnoff point, so that the load on the sense node SN side as viewed from the bit line BL is disconnected.

In the column circuit according to the present embodiment, a constant-current load section IRef is connected to the sense node SN of the column circuit via a first control switch 72. This is a constitution for the switching control of a current load for the sense node SN. This constitution forms a part of a "readout control circuit" according to the present invention. The direction of current of the constant-current load section IRef is a direction of supplying a positive charge (current) to the sense node SN in this case. The first control switch 72 is therefore of a PMOS transistor configuration.

Incidentally, the readout control circuit includes the control circuit 11 and the control voltage generating circuit 16 in FIG. 4 in addition to the above constitution. In addition, the X-decoder 2, the predecoder 3, the row decoder 4, the BLI switch 5, and the CSW driver 6 that control the memory cell array at a time of readout as well as the I/O buffer 9 and the like may be arbitrarily included in the concept of the readout control circuit.

[Outline of Readout Operation]

Readout operation supposing the configuration of FIG. 9 is as follows.

The single-ended sense amplifier 7A shown in FIG. 9 makes logic determination (H/L determination) for stored information by comparing the potential Vo of the sense node SN with the reference potential VREF. In addition, the NMOS source follower clamps the BL potential to the above (Vclamp-Vgs), whereby disturbance at the time of readout is avoided.

As described above, there are two kinds of readout operations, that is, a dynamic sense operation and a static sense operation using the constant-current load section IRef shown in FIG. 9 as a current load.

A period during which a sense amplifier reads a stored logical value from one cell, and the readout operation is performed by a plurality of sense amplifiers in parallel will be referred to as a read cycle. Performing the above-described dynamic sense operation in one read cycle will be referred to as a "dynamic read." Performing the above-described static sense operation in one read cycle will be referred to as a "static read." Further, in the present embodiment, performing the dynamic sense operation first within one read cycle and then performing the static sense operation from the middle of the read cycle will be referred to as a "hybrid read."

The readout control circuit according to the present embodiment can arbitrarily select the three read modes. In FIG. 4, the control voltage generating circuit 16 under control of the control circuit 11 turns on or off the first control switch 72 shown in FIG. 9, whereby the three read modes are performed.

[Dynamic Read]

FIGS. 10A to 10C2 are timing charts of the dynamic read.

The precharge signal (/PRE) shown in FIG. 10A is a pulse signal that is active low for a certain period from time T1 to time T2. In the dynamic read, a low active first load control signal (/DC) supplied to the first control switch 72 in FIG. 9 is set at an "H" at all times. Therefore the first control switch 72 is not turned on, and thus the current load is not connected.

When a precharge is performed at time T1, the sense node potential Vo is precharged to a readout BL voltage VR, as shown in FIG. 10C1 and FIG. 10C2.

When the precharge is ended at time T2, the sense node is set in a floating state, and a cell discharge due to the charge voltage is performed. Thus, the sense node potential Vo is lowered rapidly.

Incidentally, FIG. 10C1 shows changes in sense node potential when the variable cell resistance Rcell is in a low-resistance state, and FIG. 10C2 shows changes in sense node potential when the variable cell resistance Rcell is in a high-resistance state. In addition, two discharge lines represent a case where the resistance value of the variable resistance cell exceeds a target value and it is thus to be determined that verification has succeeded (OK) and a case where writing or erasure is insufficient and it is thus to be determined that verification has failed (NG). For example, supposing that a target resistance value at the time of low resistance is 10 [kΩ], a sense node potential when the resistance is sufficiently lowered to 9 [kΩ] is denoted as Vo(RL), and a sense node potential when the resistance is insufficiently lowered to 11 [kΩ] is denoted as Vo(RH).

In the resistance change type memory, a discharging rate is thus affected by magnitude of the resistance value of the cell, and the lower the resistance value of the cell, the more rapid the discharge. In addition, the discharge progresses with time, and potential change proceeds until the sense node potential Vo eventually becomes zero. The slope of the potential change differs greatly according to the magnitude of the resistance value.

In the case of the dynamic read, the discharging rate is slow at the time of high resistance readout, whereas a readout charge disappears quickly at the time of low resistance readout. Thus, the reference potential VREF needs to be controlled between the discharge lines of sufficient discharge and insufficient discharge, so that the setting of sense timing is relatively difficult.

The case of the static read is illustrated by similar drawing in FIGS. 11A to 11C2.

In the static read, the first load control signal (/DC) shown in FIG. 11B is controlled to an active "L" at time T2. Thus, discharge after time T2 is performed under constant-current driving. In the constant-current driving, potential change converges to a stable point determined by a current supplied by the constant-current load section IRef and the load resistance of the constant-current load section IRef. In this case, the load resistance includes the wiring resistance of the bit line and the on resistance of the switch transistor. However, most of the magnitude of the load resistance is governed by the variable cell resistance Rcell. Hence, the sense node potential converges to the stable point corresponding to the magnitude of the variable cell resistance Rcell.

At the time of low resistance shown in FIG. 11C1, a cell that causes the sense node potential Vo to become lower than the reference potential VREF is an OK cell in which sufficient lowering of resistance (writing or erasure) has been performed, and a cell that causes the sense node potential Vo to be not lower than the reference potential VREF for an indefinite period of time is an NG cell whose resistance is lowered insufficiently. The converged potentials of the respective cells are unique potentials corresponding to the respective resistance values of the cells. A large potential difference (window width.) between the OK cell and the NG cell is obtained after passage of a certain time. When the sense amplifier is started then, stable and reliable readout operation can be performed.

On the other hand, at the time of high resistance shown in FIG. 11C2, a cell having a higher stable point than the reference potential VREF is an OK cell, and a cell whose stable point is lower than the reference potential VREF is an NG cell. While it takes more time to determine whether the cell is an OK cell or an NG cell at the time of high resistance than at the time of low resistance, stable and reliable readout can be performed after passage of a certain time.

However, the static read has a disadvantage of a slower readout speed than the dynamic read.

Incidentally, FIGS. 10A to 10C2 and FIGS. 11A to 11C2 are an example. When a variable resistance element material is changed, for example, the rate of the discharge curve and the behavior of the stable point of the variable resistance element material also change variously.

Thus, there may be a resistance material allowing readout to be performed by the dynamic read, or may be a case where accurate readout cannot be performed unless the static read is performed.

Description will next be made of the hybrid read, which is a read method characteristic of the present embodiment.

[Hybrid Read]

The case of the hybrid read is illustrated by similar drawing in FIGS. 12A to 12C2. The hybrid read combines both advantages of the rapidity of the dynamic read and the stability of the static read.

More specifically, the constant-current load section IRef is made switchable by the PMOS switch (first control switch 72), and the constant-current load section IRef is switched according to sense. timing. At this time, change is made to a dynamic sense system (IRef non-connection) in an early sense period or an initial sense period, and change is made to a static sense period (IRef connection) in at least a late sense period. High-speed readout can be performed in the early sense period because of the dynamic read, and stable operation not requiring accuracy of sense timing can be performed in the late sense period because of the static read.

As shown in FIG. 12B, timing in which the first load control signal (/DC) makes a transition to the active level ("L") differs from that of the static read in FIG. 11B. In the hybrid read, the first control switch 72 in FIG. 4 is turned on at time T3 delayed from time T2 to change from the active read to the static read. Therefore, the sense node potential that rapidly progressed in discharge due to the active read before time T3 is corrected for excessive discharge because the current load is connected from time T3. That is, at the time of low resistance in FIG. 12C1, the NG cell whose resistance is insufficiently lowered causes an excessive discharge, and therefore the sense node potential changes to the stable point relatively sharply due to rapid charge by the load current. The constant-current load section IRef being close to the sense node SN also contributes to the rapid charge. On the other hand, the stable point of the OK cell whose resistance is sufficiently lowered is lower than the reference potential VREF, and thus the sense node potential directly makes a transition to the stable point.

Operation at the time of high resistance is basically the same as the above operation except only for different slopes of dynamic discharge lines.

As described above, in the hybrid read, a dynamic discharge is performed first, so that the sense node potential decreases to a low level in a short time, and after discharge under the current load is started, a transition can be made to stable operation in a relatively short time due to the reaction of the excessive decrease in sense node potential. When a window width is large, and is increased to a certain degree, sense operation can be performed by the sense amplifier, which is an advantage of the static read, and highly accurate readout can be performed.

Incidentally, being able to perform highly accurate readout in the present embodiment provides an advantage of being able to make logic determination with high accuracy even when reference voltage is controlled with fine pitches at a time of verification readout, for example.

In addition, it is too early to start the sense amplifier even at a time at a right end of FIG. 11C2 because the sense node potential in the case of the NG cell at the time of high resistance is not yet lower than the reference potential VREF even at the time at the right end of FIG. 11C2. On the other hand, in FIGS. 12A to 12C2, the NG cell and the OK cell both make a transition to defined regions with the reference potential VREF as a reference (regions into which to converge originally) at a point in time a little after time T3, so that the sense amplifier can be started at that point in time. Hence, with the hybrid read, a time for the hybrid read can be shortened by a few ten percent as compared with the static read, and stable readout similar to the static read can be performed.

The timing of time T3 can be adjusted arbitrarily.

[Examples of Combinations of Read Modes]

A table of FIG. 13 shows four examples of combination of the dynamic read, the static read, and the hybrid read for write verification readout, erase verification readout, and ordinary readout.

Information on this combination which information is internally retained by the control circuit 11 itself or supplied from external controlling means is used to select a sequence, and the control circuit 11 controls the control voltage generating circuit 16 and the like to perform the sequence.

As in the four examples, in the write verification readout, the static read (S) or the hybrid read (H) is performed, but the dynamic read (D) cannot be used because discharge is too rapid.

In contrast to this, in the erase verification readout, the static read takes too much time, and is thus not practical.

A method that facilitates readout can be arbitrarily selected for the ordinary readout according to the above-described variable cell resistance material and the like. In this example, the static read (S) or the hybrid read (H) is desirable in consideration of stability, but the dynamic read (D) is not excluded.

<3. Second Embodiment>

The present embodiment and subsequent embodiments represent modifications of circuit configurations of the sense amplifier and the like. Thus, a general configuration, circuits and block configurations other than those related to the modifications, and the basics of operation are similar to those of the first embodiment. Description will therefore be made centering on the modifications.

FIG. 14 is a schematic diagram of a column circuit configuration according to the present embodiment. FIGS. 15A to 17C2 show control waveforms and timing of a dynamic read, a static read, and a hybrid read.

Supplied pulses are determined so as to correspond to reversed conductivity types of main transistors (FIG. 15A, FIG. 15B, FIG. 16A, FIG. 16B, FIG. 17A, and FIG. 17B). In addition, inverted signals (high active signals) of the first load control signal (/DC) and the precharge signal (/PRE), which inverted signals are denoted with "/" removed, are supplied from a control circuit 11 and a control voltage generating circuit 16.

Thus, the relation between discharge and charge is reversed. Except for this, temporal transitions of discharge (or charge) are substantially the same in the first and second embodiments (though the waveforms are inverted in the second embodiment).

<4. Third Embodiment>

Figure 21A:
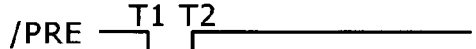
Figure 21B:
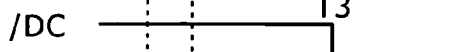

FIG. 18 is a schematic diagram of a column circuit configuration according to a third embodiment. FIGS. 19A to 21C2 show control waveforms and timing of a dynamic read, a static read, and a hybrid read.

The circuit configuration shown in FIG. 18 is different from that of FIG. 9 in that a voltage applied to a plate line PL connected to a variable cell resistance Rcell is a readout BL voltage VR (>0), and in that a voltage line connected to a precharge transistor 71 is conversely a GND voltage supply line. That is, the direction of a cell current is reversed. In addition, the precharge transistor 71 and a first control switch 72 are changed from a PMOS transistor to an NMOS transistor, and a load separating switch 52 is changed from an NMOS transistor to a PMOS transistor. The orientation of a current source connected to the first control switch 72 (direction of a current made to flow) is also reversed.

The other configuration on a memory cell side in FIG. 18 is similar to that of FIG. 9, and basic operation is also the same.

The load separating switch 52, the precharge transistor 71, and the first control switch 72 are connected to a bit line BL to which a memory cell MC as a readout object is connected, as in the first embodiment.

On the other hand, a sense amplifier 7B in the present embodiment is of a mirror current differential type. Whereas the inverting input (31) of the single-ended sense amplifier 7A in FIG. 9 is supplied from the control voltage generating circuit 16 or the like, the present embodiment internally generates the inverting input within a memory cell array 1.

Specifically, a reference column opposite to a regular memory column as an object of operation is provided. The reference column has a similar configuration to that of the memory cell MC, and thus description thereof will be omitted.

When the reference cell is used, circuit scale is increased, but timing design is easy because a reference voltage Vref changes so as to follow change in sense node potential Vo, as shown in FIGS. 19A to 21C2.

<5. Fourth Embodiment>

FIG. 22 is a schematic diagram of a column circuit configuration according to a fifth embodiment. FIGS. 23A to 25C2 show control waveforms and timing of a dynamic read, a static read, and a hybrid read.

A manner of supplying voltage and the conductivity types of transistors are reversed to make the direction of cell current opposite from that of FIG. 18 as in the case where the direction of cell current is reversed for the single-ended type.

As in the third embodiment, a reference column opposite to a regular memory column as an object of operation is provided. The reference column has a similar configuration to that of the memory cell MC, and thus description thereof will be omitted.

When the reference cell is used, circuit scale is increased, but timing design is easy because a reference voltage Vref changes so as to follow change in sense node potential Vo, as shown in FIGS. 23A to 25C2.

<6. Modification Example>

While the ReRAM has been taken as an example in the four embodiments described above, the present invention is widely applicable to resistance change type memories such as phase change memories other than the ReRAM.

In addition, other nonvolatile memories such as flash memories may allow readout operation without word line control, that is, without a constant current. There has been a report on such an operation in an MCL-NOR type, for example. With such an operation, sense timing may differ greatly according to the logical value of information to be read out or according to a kind (mode) of readout.

Thus, while the present invention is desirably applied to resistance change type memories with a wide dynamic range of readout current, the description of the above embodiments is not intended to exclude application of the present invention to other nonvolatile memories.

The above first to fourth embodiments and the modification example make it possible to provide a nonvolatile semiconductor memory device that can satisfy rapidity and readout accuracy in an ReRAM that performs so-called dynamic readout operation.

The present application contains subject matter related to that disclosed in Japanese Priority Patent Application JP 2010-030528 filed in the Japan Patent Office on Feb. 15, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile semiconductor memory device comprising:

a memory element in which a rate of charge discharge between two electrodes of the memory element differs according to a logical value of stored information;

cell wiring connected to one electrode of said memory element;

a sense amplifier having a sense node connected to said cell wiring, the sense amplifier reading the logical value of said information by comparing a potential of the sense node with a reference potential; and a readout control circuit configured for selectively performing:

a dynamic sense operation that comprises performing readout by applying a precharge voltage to said sense node for a predetermined period of time, thereby precharging said cell wiring, ending application of the precharge voltage, and discharging or charging said cell wiring via said memory element, and a static sense operation that comprises performing readout in a state in which a current load is connected to said sense node.

2. The nonvolatile semiconductor memory device according to claim 1, wherein said readout control circuit is configured for arbitrarily selecting a dynamic read that comprises performing said dynamic sense operation in one read cycle, a static read that comprises performing said static sense operation in one read cycle, and a hybrid read that comprises changing to said static sense operation after said dynamic sense operation in one read cycle.

3. The nonvolatile semiconductor memory device according to claim 2, wherein said readout control circuit is configured to perform readout in a plurality of readout modes comprising a write verification readout mode after an operation of writing said information, an erase verification readout mode after erasing operation, and an ordinary readout mode, and wherein, for each one of the plurality of readout modes, the readout control circuit is configured to perform readout by one of said dynamic read, said static read, or said hybrid read.

4. The nonvolatile semiconductor memory device according to claim 1, wherein said readout control circuit includes:

a precharge section connected to said sense node and configured to apply said precharge voltage to said sense node;

a constant-current load section connected to said sense node via a first control switch and configured to provide said current load; and a control signal generating section configured to generate a control signal for controlling said first control switch.

5. The nonvolatile semiconductor memory device according to claim 4, wherein said sense amplifier is a single-ended sense amplifier for comparing the potential of said sense node, the potential of said sense node being supplied to one input of the sense amplifier, with the reference potential supplied to another input of the sense amplifier, and amplifying the potential of said sense node.

6. The nonvolatile semiconductor memory device according to claim 1, wherein said readout control circuit includes a reference line, a reference memory element connected to said reference line, the reference memory element having a resistance value equivalent to a resistance value of said memory element, a diode-connected transistor connected to a reference node of said reference line via a second control switch, said reference potential occurring at a gate of the diode-connected transistor, a reference constant-current load section connected to said reference node, and a control signal generating section configured to generate a control signal for controlling a first control switch and said second control switch, and said sense amplifier is a current mirror type differential sense amplifier for comparing the potential of said sense node, said sense node being connected to one input of the sense amplifier, with the reference potential supplied to another input of the sense amplifier, and amplifying the potential of said sense node, the current mirror type differential sense amplifier including a mirror current load transistor, the mirror current load transistor being connected to said sense node via the first control switch and having a gate connected to the gate of the diode-connected transistor, whereby a mirror current of a reference line current flows through the mirror current load transistor.

7. The nonvolatile semiconductor memory device according to claim 1, wherein a load separating switch for separating the cell wiring from a load on a sense node side when said cell wiring is controlled to be at a constant voltage and the potential of the sense node is amplified is connected between said cell wiring and said sense node.

8. The nonvolatile semiconductor memory device according to claim 7, wherein said load separating switch is formed of one of an NMOS transistor, a PMOS transistor, and a transfer gate circuit formed by connecting an NMOS transistor and a PMOS transistor in parallel with each other.

9. The nonvolatile semiconductor memory device according to claim 7, wherein said load separating switch is an NMOS transistor, a clamp voltage is applied from said readout control circuit to a gate of the NMOS transistor, whereby said cell wiring is clamped to a voltage lower than said clamp voltage by a voltage between the gate of said NMOS transistor and a source of said NMOS transistor, and said sense node having a voltage amplitude generated by a sense operation and said cell wiring are subjected to load separation.

10. The nonvolatile semiconductor memory device according to claim 1, wherein said memory element is a resistance change type memory element in which a logical value of writing information corresponds to a resistance of a memory material disposed in said memory element, wherein said resistance of said memory material changes according to a direction of voltage applied to the memory material.

11. The nonvolatile semiconductor memory device according to claim 6, wherein said memory element and said reference memory element are a resistance change type memory element in which a logical value of writing information corresponds to a resistance of a memory material disposed in said memory element, wherein said resistance of said memory material changes according to a direction of voltage applied to the memory material.

12. The nonvolatile semiconductor memory device according to claim 3, wherein for said erase verification readout mode, said readout control circuit is configured to perform readout by one of said hybrid readout and said dynamic readout.

13. The nonvolatile semiconductor memory device according to claim 12, wherein for said ordinary readout mode, said readout control circuit is configured to perform readout by one of said hybrid readout and said static readout.

14. The nonvolatile semiconductor memory device according to claim 13, wherein for said write verification readout mode, said readout control circuit is configured to perform readout by one of said hybrid readout and said static readout.

15. The nonvolatile semiconductor memory device according to claim 14, wherein for said erase verification readout mode, for said ordinary readout mode, and for said write verification mode, said readout control circuit is configured to perform readout by said hybrid readout.

16. The nonvolatile semiconductor memory device according to claim 14,
wherein for said erase verification readout mode and for said ordinary readout mode, said readout control circuit is configured to perform readout by said hybrid readout, and
wherein for write verification mode, said readout control circuit is configured to perform readout by said static readout.

17. The nonvolatile semiconductor memory device according to claim 14,
wherein for said erase verification readout mode said readout control circuit is configured to perform readout by said hybrid readout, and
wherein for said ordinary readout mode and for said write verification readout mode, said readout control circuit is configured to perform readout by said static readout.

18. The nonvolatile semiconductor memory device according to claim 14,
wherein for said erase verification readout mode said readout control circuit is configured to perform readout by said dynamic readout, and
wherein for said ordinary readout mode and for said write verification readout mode, said readout control circuit is configured to perform readout by said static readout.

19. An electronic apparatus comprising the nonvolatile semiconductor memory device of claim 1.

20. A method of reading information from a nonvolatile semiconductor memory device, wherein the nonvolatile semiconductor memory device comprises a memory element in which a rate of charge discharge between two electrodes of the memory element differs according to a logical value of stored information; cell wiring connected to one electrode of said memory element; and a sense amplifier having a sense node connected to said cell wiring, and wherein the method of reading information comprises sequentially:
applying a precharge voltage to the cell wiring for a predetermined pulse period, thereby precharging the cell wiring;
ending application of the precharge voltage to the cell wiring and allowing charge to begin to flow through the memory element;
after a period of time has elapsed from the ending of the application of the precharge voltage to the cell wiring, connecting a constant current source to the sense node; and
causing the sense amplifier to read the logical value of said stored information by comparing a potential of the sense node with a reference potential.

* * * * *